(12) United States Patent
Avouris et al.

(10) Patent No.: US 8,698,165 B2
(45) Date of Patent: Apr. 15, 2014

(54) GRAPHENE CHANNEL-BASED DEVICES AND METHODS FOR FABRICATION THEREOF

(71) Applicant: International Business Machines Corporation, Armonk, NY (US)

(72) Inventors: Phaedon Avouris, Yorktown Heights, NY (US); Kuan-Neng Chen, Hsinchu (TW); Damon Farmer, White Plains, NY (US); Yu-Ming Lin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/875,642

(22) Filed: May 2, 2013

(65) Prior Publication Data

US 2013/0240839 A1 Sep. 19, 2013

Related U.S. Application Data

(62) Division of application No. 12/783,676, filed on May 20, 2010, now Pat. No. 8,445,320.

(51) Int. Cl.
*H01L 29/15* (2006.01)

(52) U.S. Cl.
USPC ........ 257/77; 257/76; 257/782; 257/E21.632; 257/E29.082

(58) Field of Classification Search
USPC .................. 257/76, 77, 782, 784, E21.632, 257/E23.019, E29.082; 438/455
See application file for complete search history.

(56) References Cited

U.S. PATENT DOCUMENTS

| | | | |
|---|---|---|---|
| 7,015,142 | B2 | 3/2006 | DeHeer et al. |
| 7,619,257 | B2 | 11/2009 | Pfeiffer |
| 2004/0253820 | A1 | 12/2004 | DeHeer et al. |
| 2005/0212014 | A1 | 9/2005 | Horibe et al. |

(Continued)

FOREIGN PATENT DOCUMENTS

| | | |
|---|---|---|
| JP | 2007335532 A | 12/2007 |
| WO | WO2009023349 A2 | 2/2009 |

OTHER PUBLICATIONS

English Abstract of JP2007335532A filed by Yo Kanji; Univ Hokkaido, published Dec. 27, 2007.

(Continued)

*Primary Examiner* — Julia Slutsker
(74) *Attorney, Agent, or Firm* — Vazken Alexanian; Michael J. Chang, LLC

(57) ABSTRACT

Graphene-channel based devices and techniques for the fabrication thereof are provided. In one aspect, a semiconductor device includes a first wafer having at least one graphene channel formed on a first substrate, a first oxide layer surrounding the graphene channel and source and drain contacts to the graphene channel that extend through the first oxide layer; and a second wafer having a CMOS device layer formed in a second substrate, a second oxide layer surrounding the CMOS device layer and a plurality of contacts to the CMOS device layer that extend through the second oxide layer, the wafers being bonded together by way of an oxide-to-oxide bond between the oxide layers. One or more of the contacts to the CMOS device layer are in contact with the source and drain contacts. One or more other of the contacts to the CMOS device layer are gate contacts for the graphene channel.

12 Claims, 11 Drawing Sheets

(56) References Cited

U.S. PATENT DOCUMENTS

| | | | |
|---|---|---|---|
| 2005/0266605 A1 | 12/2005 | Kawakami | |
| 2006/0290343 A1 | 12/2006 | Crafts et al. | |
| 2007/0102111 A1 | 5/2007 | Monsma et al. | |
| 2008/0312088 A1 | 12/2008 | Chung et al. | |
| 2009/0020764 A1* | 1/2009 | Anderson et al. | 257/77 |
| 2009/0140801 A1 | 6/2009 | Ozyilmaz et al. | |
| 2009/0294814 A1 | 12/2009 | Assefa et al. | |
| 2009/0302394 A1* | 12/2009 | Fujita | 257/369 |
| 2010/0006823 A1 | 1/2010 | Anderson et al. | |
| 2010/0051897 A1 | 3/2010 | Chen et al. | |
| 2010/0051960 A1 | 3/2010 | Chen et al. | |
| 2010/0102292 A1 | 4/2010 | Hiura et al. | |

OTHER PUBLICATIONS

Fiori et al., "Simulation of Graphene Nanoribbon Field-Effect Transistors," IEEE Electron Device Letters, v. 28, No. 8, pp. 760-762 (Aug. 2007).

Song, "Fabrication and Characterization of Nonpatterned Epitaxial Graphene Films for Carbon Based Electronics," Dissertation, Georgia Institute of Technology School of Physics (Dec. 2006).

Liu et al., "Fabrication of Graphene p-n-p Junctions with Contactless Top Gates," Applied Physical Letters, v. 92, No. 20, pp. 203103-1-203103-3 (May 2008).

Seminov et al., "Spin Field Effect Transistor with a Graphene Channel," Applied Physics Letters, vol. 91, No. 15, pp. 153105-1-153105-3 (Oct. 2007).

Falkovsky, "Unusual Field and Temperature Dependence of the Hall Effect in Graphene," Physical Review B (Condensed Matter and Materials Physics), vol. 75, No. 3, pp. 33409-1-33409-4 (Jan. 2007).

J. Zhu et al., "A Novel Graphene Channel Field Effect Transistor with Schottky Tunneling Source and Drain" IEEE (Sep. 2007).

Chen, et al., "Structure, Design and Process Control for Cu Bonded Interconnects in 3D Integrated Circuits," International Electron Devices Meeting (IEDM), pp. 367-370 (Dec. 2006).

Chen et al., "Improved Manufacturability of Cu Bond Pads and Implementation of Seal Design in 3D Integrated Circuits and Packages," 23rd International VLSI Multilevel Interconnection (VMIC) Conference, Fremont CA pp. 25-28 (Sep. 2006).

Avouris et al., "Carbon-Based Electronics," Nature Nanotechnology, vol. 2 (Oct. 2007).

Tsai et al., "Selective Carbon Nanotube Growth on Silicon Tips with the Soft Electrostatic Force Bonding and Catalyst Transfer Concepts," Nanotechnology 16 (Apr. 2005).

Geim et al., "The Rise of Graphene," Nature Materials, vol. 6 (Mar. 2007).

* cited by examiner

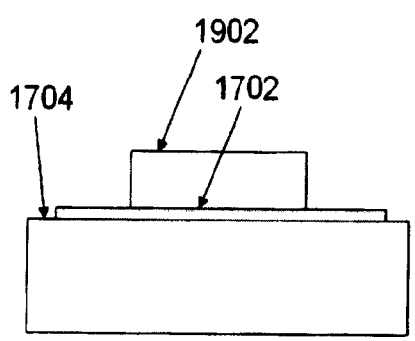
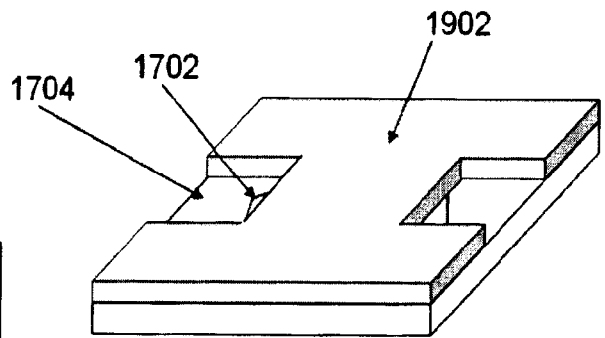
FIG. 19  FIG. 20
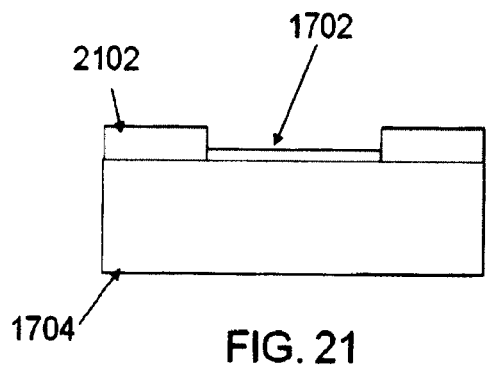
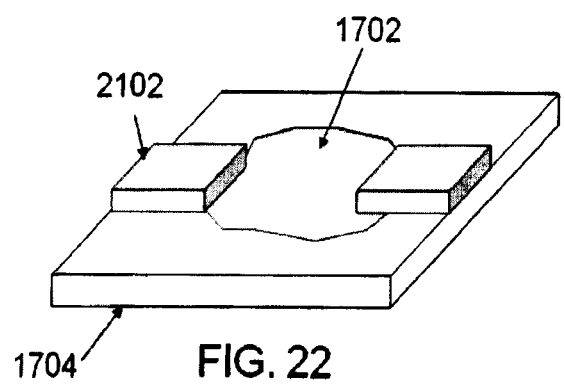
FIG. 21  FIG. 22
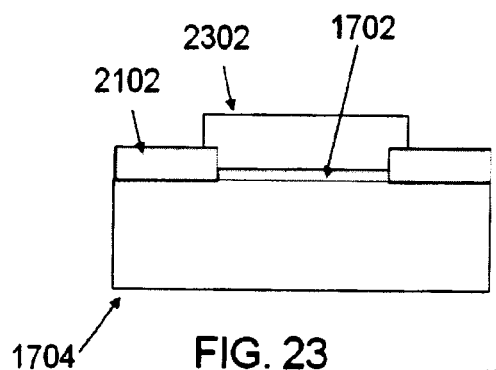
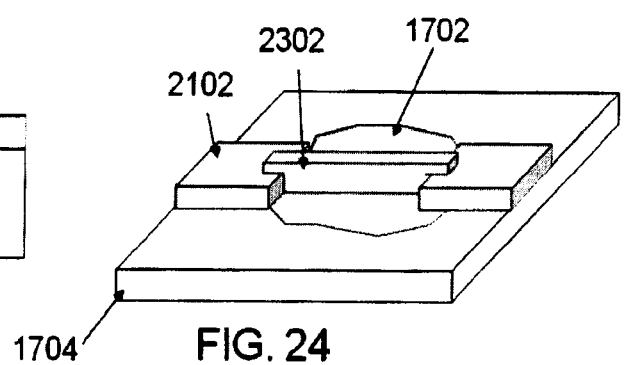
FIG. 23  FIG. 24

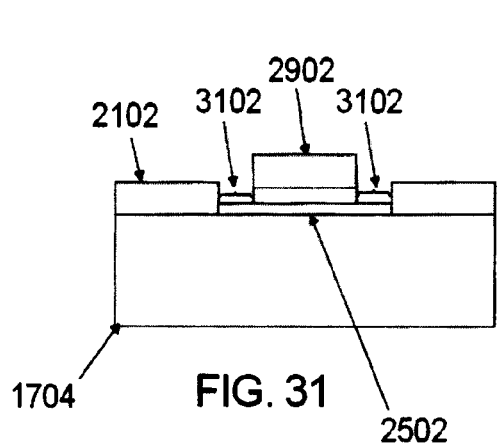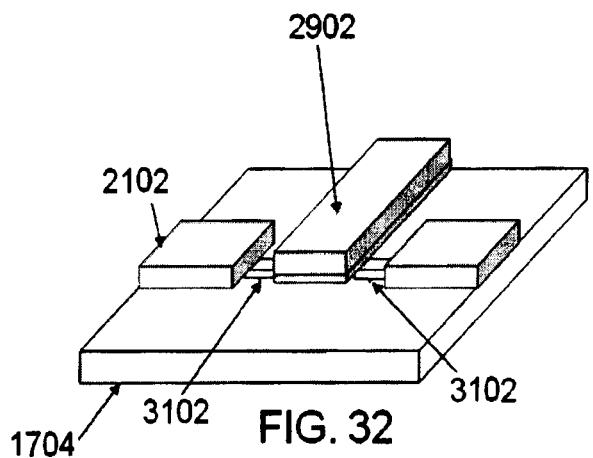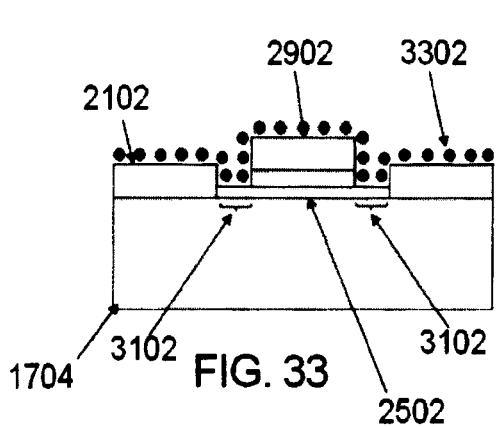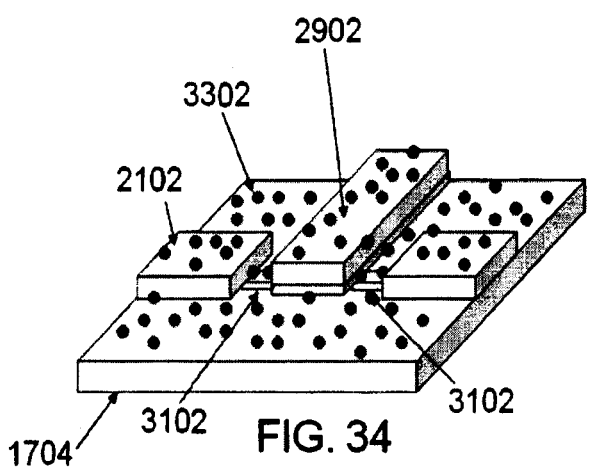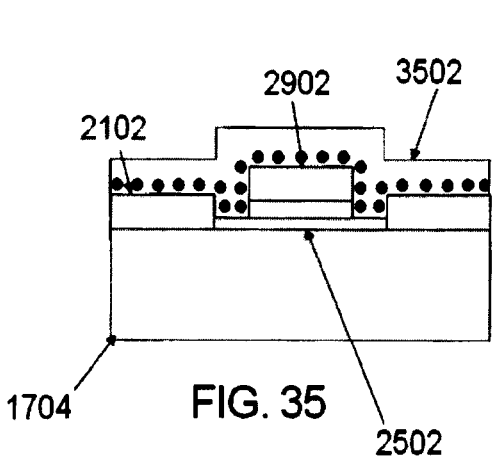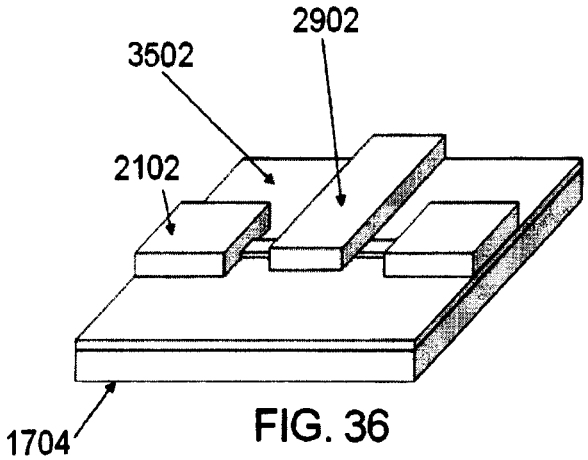

GRAPHENE CHANNEL-BASED DEVICES AND METHODS FOR FABRICATION THEREOF

CROSS-REFERENCE TO RELATED APPLICATIONS

This application is a divisional of U.S. application Ser. No. 12/783,676 filed on May 20, 2010, the contents of which are fully incorporated by reference herein.

FIELD OF THE INVENTION

The present invention relates to graphene-based devices, and more particularly, to graphene-channel based devices and techniques for the fabrication thereof.

BACKGROUND OF THE INVENTION

Graphene is a single layer of graphite. Graphene possesses extraordinary electronic properties. For example, the electron carriers in graphene exhibit very high mobilities that are attractive for high-performance radio frequency (rf) circuits. One major challenge in utilizing devices and complex circuits involving graphene is the incompatibility of the growth conditions of graphene and the process limitation of current complementary metal-oxide semiconductor (CMOS) technology. For example, graphene layers grown epitaxially from silicon carbide (SiC) substrates require a reaction temperature of at least 1,200 degrees Celsius (° C.), which greatly exceeds the temperature cap of from about 350° C. to about 400° C. for CMOS processes. One way to obtain graphene sheets at lower temperatures is achieved by mechanical exfoliation of bulk graphite and the transfer to suitable substrates. Nevertheless, during the subsequent processes, graphene obtained from either approach may be destroyed via oxidation and the properties of the graphene may also be altered.

Due to its high carrier mobility, graphene is an attractive material as the active component in rf circuit applications. For rf circuits, the performance of a transistor is mainly determined by the cut-off frequency, i.e., the frequency at which the current gain of the transistor becomes unity. In order to improve the cut-off frequency of a transistor, it is necessary to minimize the parasitic capacitance and residual resistance associated with contacts and interconnects of the transistor.

In general, a field effect transistor (FET) includes a source, a drain and a channel(s) connecting the source and the drain. A gate, separated from the channel by a dielectric, regulates electron flow through the channel. Metal contacts (electrodes) are typically provided to the source, drain and gate. With conventional graphene-based FETs, two types of gate structures are usually adopted. In the first type, the gate contact overlaps with the source/drain metal contacts to ensure good gate control. In the second type, the gate underlaps the source/drain contacts to avoid the parasitic capacitance between the gate and the source/drain contacts. In the first design, device performance suffers from the significant parasitic capacitance due to the contact overlap. In the second design, the ungated region between the gate and the source/drain contacts contributes to the residual series resistance. Either design fails to address the issue of parasitic capacitance and residual series resistance simultaneously for high performance operation.

Therefore a new fabrication scheme that effectively combines existing CMOS technology and graphene, so as to permit the successful use of graphene as the active or passive element in practical devices and/or circuits, would be desirable, as would graphene-based transistor device designs that minimize both parasitic capacitance and residual series resistance.

SUMMARY OF THE INVENTION

The present invention provides graphene-channel based devices and techniques for the fabrication thereof. In one aspect of the invention, a semiconductor device is provided. The semiconductor device includes a first wafer having at least one graphene channel formed on a first substrate, a first oxide layer surrounding the graphene channel and source and drain contacts to the graphene channel that extend through the first oxide layer; and a second wafer having a complementary metal oxide semiconductor (CMOS) device layer formed in a second substrate, a second oxide layer surrounding the CMOS device layer and a plurality of contacts to the CMOS device layer that extend through the second oxide layer, the first wafer and the second wafer being bonded together by way of an oxide-to-oxide bond between the first and second oxide layers. One or more of the contacts to the CMOS device layer are in contact with the source and drain contacts to the graphene channel. One or more other of the contacts to the CMOS device layer are gate contacts for the graphene channel.

In another aspect of the invention, a method of fabricating a semiconductor device is provided. The method includes the following steps. A first wafer is formed having at least one graphene channel formed on a first substrate, a first oxide layer surrounding the graphene channel and source and drain contacts to the graphene channel that extend through the first oxide layer. A second wafer is formed having a CMOS device layer formed in a second substrate, a second oxide layer surrounding the CMOS device layer and a plurality of contacts to the CMOS device layer that extend through the second oxide layer. The first wafer and the second wafer are bonded together by way of an oxide-to-oxide bond between the first and second oxide layers, such that one or more of the contacts to the CMOS device layer are in contact with the source and drain contacts to the graphene channel, and one or more other of the contacts to the CMOS device layer are gate contacts for the graphene channel.

In yet another aspect of the invention, a transistor device is provided. The transistor device includes a substrate; source and drain contacts formed on the substrate; a graphene channel formed on the substrate connecting the source and drain contacts; and a gate contact over the graphene channel, separated from the graphene channel by a dielectric, wherein the gate contact is in a non-overlapping position with the source and drain contacts leaving exposed sections of the graphene channel between the gate contact and the source and drain contacts, and wherein the exposed sections of the graphene channel are doped with an n-type or p-type dopant.

In still yet another aspect of the invention, a method of fabricating a transistor device is provided. The method includes the following steps. A substrate is provided. Source and drain contacts are formed on the substrate. A graphene channel is formed on the substrate connecting the source contact and the drain contact. A gate contact is formed over the graphene channel and separated from the graphene channel by a dielectric, wherein the gate contact is in a non-overlapping position with the source and drain contacts leaving exposed sections of the graphene channel between the gate contact and the source and drain contacts. The exposed sections of the graphene channel are doped with an n-type or p-type dopant.

A more complete understanding of the present invention, as well as further features and advantages of the present invention, will be obtained by reference to the following detailed description and drawings.

BRIEF DESCRIPTION OF THE DRAWINGS

FIG. 19 is a cross-sectional diagram illustrating a resist mask patterned over the graphene layer(s)/substrate according to an embodiment of the present invention;

FIG. 20 is a 3D diagram illustrating a top-down view of the resist mask patterned over the graphene layer(s)/substrate according to an embodiment of the present invention;

FIG. 21 is a cross-sectional diagram illustrating source/drain contact metal having been deposited around the patterned resist mask according to an embodiment of the present invention;

FIG. 22 is a 3D diagram illustrating a top-down view of the source/drain contact metal having been deposited around the patterned resist mask according to an embodiment of the present invention;

FIG. 23 is a cross-sectional diagram illustrating a mask patterned on the graphene layer(s) to define an active channel region according to an embodiment of the present invention;

FIG. 24 is a 3D diagram illustrating a top-down view of the mask patterned on the graphene layer(s) according to an embodiment of the present invention;

FIG. 31 is a cross-sectional diagram illustrating portions of the gate dielectric not covered by the gate metal contact having been etched away according to an embodiment of the present invention;

FIG. 32 is a 3D diagram illustrating a top-down view of the portions of the gate dielectric not covered by the gate metal contact having been etched away according to an embodiment of the present invention;

FIG. 33 is a cross-sectional diagram illustrating a dopant having been blanket deposited over the source and drain metal contacts, the gate metal contact, exposed sections of the graphene channel and the substrate according to an embodiment of the present invention;

FIG. 34 is a 3D diagram illustrating a top-down view of the dopant having been blanket deposited over the source and drain metal contacts, the gate metal contact, the exposed sections of the graphene channel and the substrate according to an embodiment of the present invention;

FIG. 35 is a cross-sectional diagram illustrating a protective capping layer having been formed over the source and drain metal contacts, the gate metal contact, the exposed sections of the graphene channel and the substrate according to an embodiment of the present invention; and FIG. 36 is a 3D diagram illustrating a top-down view of the protective capping layer having been formed over the source and drain metal contacts, the gate metal contact, the exposed sections of the graphene channel and the substrate according to an embodiment of the present invention.

DETAILED DESCRIPTION OF PREFERRED EMBODIMENTS

Provided herein are graphene-channel based devices and techniques for the fabrication thereof. The present techniques address the above-described problems associated with complementary metal-oxide semiconductor (CMOS)/graphene processing temperature incompatibilities during fabrication (see, for example, FIGS. 1-16, described below) and parasitic capacitance and residual resistance in the completed devices (see, for example, FIGS. 17-36, described below).

FIGS. 1-16 are diagrams illustrating an exemplary methodology for fabricating a semiconductor device having both graphene-based and CMOS circuitry. As will be described in detail below, the present techniques make use of a novel three-dimensional (3D) integration approach that involves separately fabricating the graphene and the CMOS circuitry and then integrating the graphene and the CMOS circuitry using wafer bonding processes. By separately fabricating the graphene and the CMOS circuitry and then integrating the two later in the process, the problems associated with graphene formation temperatures exceeding the process limitations of the CMOS fabrication can be avoided.

Figure 1:
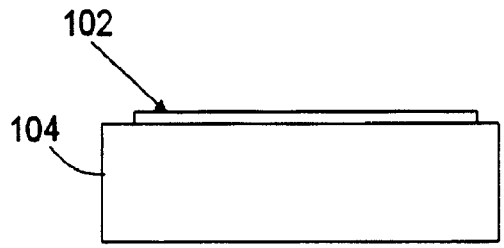
FIG. 1 is a cross-sectional diagram illustrating a graphene layer(s) having been deposited or grown on a substrate according to an embodiment of the present invention.
Figure 2:
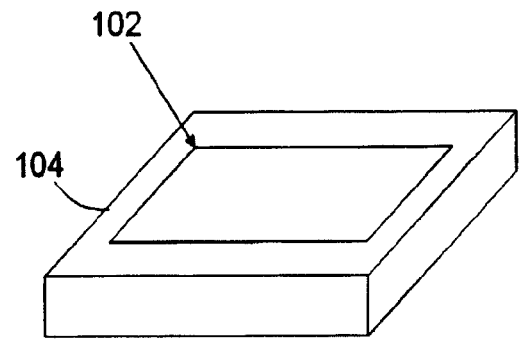
FIG. 2 is a three-dimensional (3D) diagram illustrating a top-down view of the graphene layer(s) on the substrate according to an embodiment of the present invention.

FIG. 1 is a cross-sectional diagram illustrating one or more graphene layers 102 (e.g., from a single layer up to 10 layers of graphene) having been deposited or grown on a substrate 104. When the graphene layer(s) 102 are deposited, e.g., using mechanical exfoliation, substrate 104 can be an insulating wafer or a wafer with an insulating overlayer, such as a silicon (Si) wafer covered with silicon dioxide ($SiO_2$). When the graphene layer(s) 102 are grown, e.g., by silicon sublimation with epitaxy, substrate 104 can be a silicon carbide (SiC) wafer. Techniques for depositing a graphene layer(s) on a substrate that involve, for example, exfoliation and/or techniques for growing a graphene layer(s) on a substrate that involve, for example, SiC epitaxy, are known to those of skill in the art and thus are not described further herein. FIG. 2 is a 3D diagram illustrating another perspective, i.e., a top-down view, of the graphene layer(s) 102 (deposited or grown) on the substrate 104.

Figure 3:
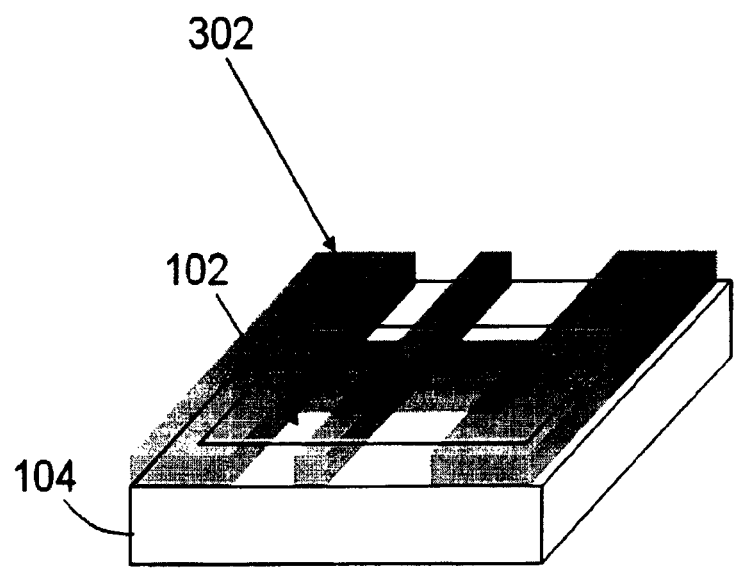
FIG. 3 is a 3D diagram illustrating a mask having been formed over the graphene/substrate according to an embodiment of the present invention.
Figure 4:
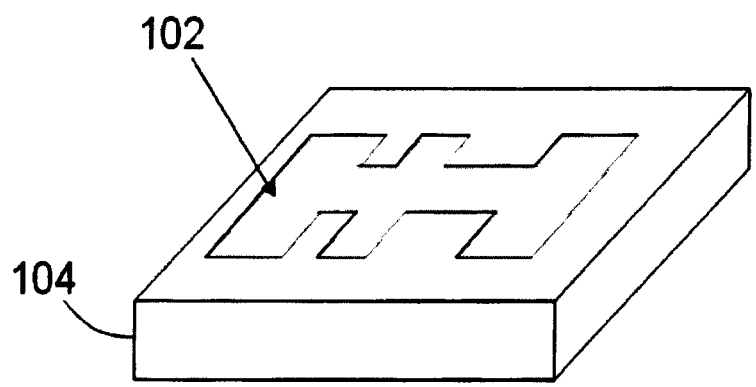
FIG. 4 is a 3D diagram illustrating the graphene layer(s) having been etched around the mask to pattern and thus define channels according to an embodiment of the present invention.

The graphene will be configured to serve as an active channel(s) of one or more transistors of the device (also referred to herein as "graphene channel transistors" or simply "graphene transistors"). Thus, the next step in the methodology is to pattern the graphene layer(s) with the layout of the channel(s). FIG. 3 is a 3D diagram illustrating a mask 302 having been formed over the graphene/substrate. The mask will be used to etch away unwanted areas of the graphene layer(s). According to an exemplary embodiment, mask 302 is made of poly(methyl methacrylate) (PMMA). Techniques for forming a, e.g., PMMA, etching mask are known to those of skill in the art and thus are not described further herein. Next, an etch (around mask 302) is used to pattern the graphene and thereby define the channel(s). FIG. 4 is a 3D diagram illustrating the patterned graphene layer(s) 102.

According to an exemplary embodiment, the graphene is etched by oxygen plasma. As shown in FIG. 4, after etching the mask 302 is removed. For an exemplary mask formed by PMMA, the mask can be removed in solvents such as acetone.

Figure 5:
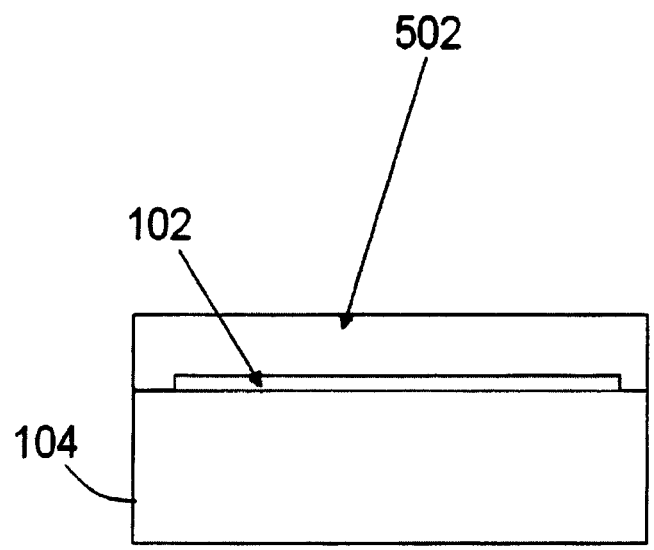
FIG. 5 is a cross-sectional diagram illustrating an oxide layer having been deposited over the patterned graphene layer(s) and substrate according to an embodiment of the present invention.

An oxide layer is then deposited so as to surround the patterned graphene layer(s). Namely, FIG. 5 is a cross-sectional diagram illustrating an oxide layer 502 having been deposited over the patterned graphene layer(s) 102/substrate 104. According to an exemplary embodiment, oxide layer 502 is deposited over the patterned graphene/substrate using atomic layer deposition (ALD) and/or low-temperature chemical vapor deposition (CVD). This oxide will serve two purposes. First, it will serve as gate dielectrics for the channel(s) in the graphene transistors, see below. Second, the oxide will later be used to protect the graphene from damage during subsequent processing. Additionally, the oxide layer will be used later in the process during a wafer bonding step to form an oxide-to-oxide bond with a counterpart CMOS device wafer. A functionalization process on the surface of the graphene may be required to produce uniform oxide coverage. As an example, the surface of the graphene can be functionalized by reacting it with nitrogen dioxide ($NO_2$) prior to the ALD oxide deposition. As another example, a thin layer of aluminum (Al), e.g., from about one nanometer (nm) to about two nm thick, can be deposited and naturally oxidized on the graphene surface prior to the ALD process.

Figure 6:
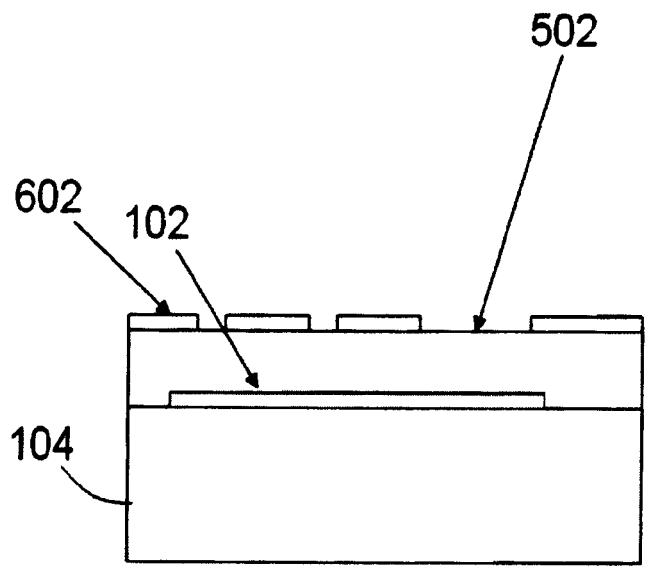
FIG. 6 is a cross-sectional diagram illustrating an etching mask having been formed over the oxide layer according to an embodiment of the present invention.
Figure 7:
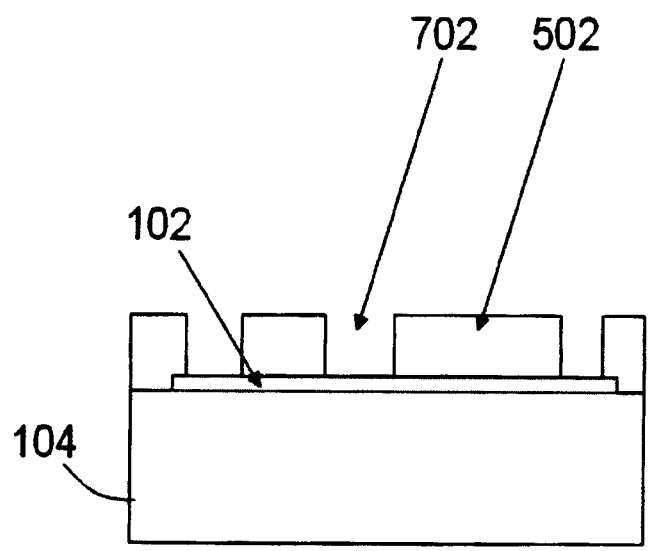
FIG. 7 is a cross-sectional diagram illustrating trenches having been etched into the oxide layer exposing underlying portions of graphene layer(s) according to an embodiment of the present invention.

A mask is then formed over the oxide layer which will be used in defining source and drain contacts of the graphene channel(s). Namely, FIG. 6 is a cross-sectional diagram illustrating etching mask 602 having been formed over oxide layer 502. The mask can be an electron-beam (e-beam) resist mask material, such as PMMA, or a metal hardmask. Techniques for forming a resist mask or a metal hardmask are known to those of skill in the art and thus are not described further herein Etching is then used to expose regions of the graphene layer(s) for metal contact formation. Namely, FIG. 7 is a cross-sectional diagram illustrating trenches 702 having been etched into oxide layer 502 exposing underlying portions of graphene layer(s) 102. According to an exemplary embodiment, wet etching is used to form trenches 702. Mask 602, which is used as a mask during the etch, is then removed. For an exemplary mask formed by PMMA, the mask can be removed in solvents such as acetone.

Figure 8:
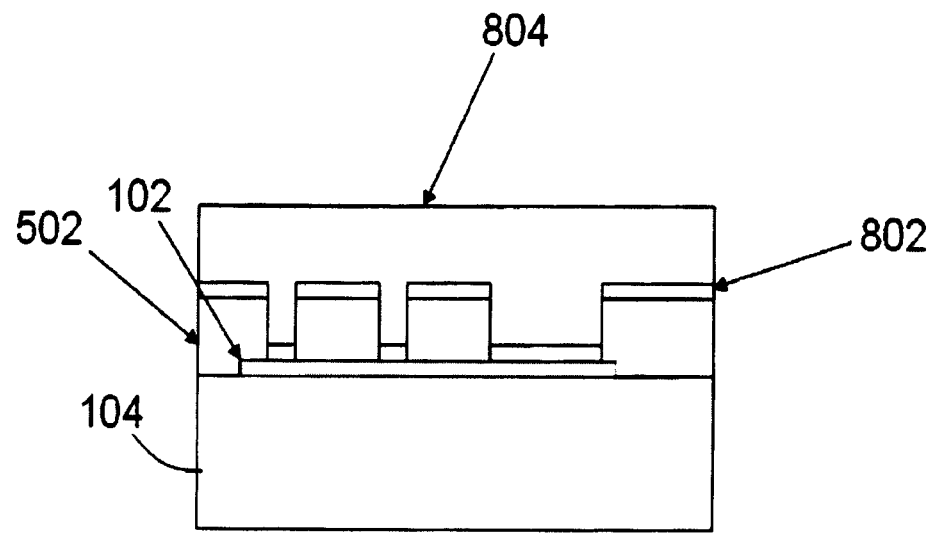
FIG. 8 is a cross-sectional diagram illustrating metal having been deposited over the oxide layer filling the trenches according to an embodiment of the present invention.

Subsequently, metal is deposited on oxide layer 502 filling trenches 702. See, for example, FIG. 8. According to the exemplary embodiment shown illustrated in FIG. 8, the metal is made up of two layers, a first metal layer 802 and a second metal layer 804. The first (bottom) metal layer consists of a metal(s) that enables good contact with graphene, e.g., palladium (Pd) and titanium (Ti), while the second (top) metal layer consists of copper (Cu) that allows for adhesion in a subsequent wafer bonding step (see below). Thus, as shown in FIG. 8, the metal makes contact with the previously exposed portions of the graphene layer(s). By way of example only, the first metal layer can be deposited using e-beam evaporation and sputtering to a thickness of from about one nm to about 100 nm, and the second metal layer can be deposited using electrochemical deposition to a thickness of from about five nm to about 100 micrometers ($\mu m$).

Figure 9:
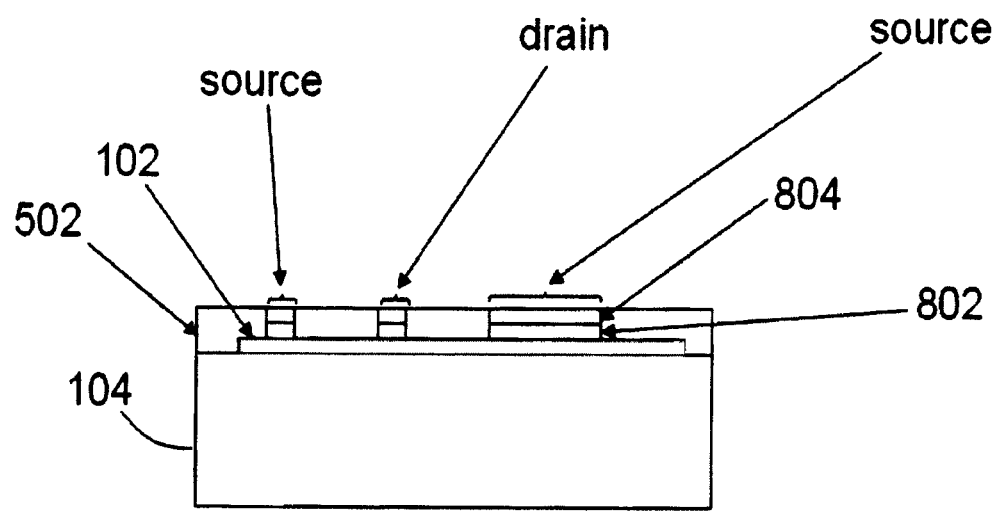
FIG. 9 is a cross-sectional diagram illustrating source and drain region metal contacts having been formed from the deposited metal according to an embodiment of the present invention.

FIG. 9 is a cross-sectional diagram illustrating source and drain region metal contacts having been formed from the deposited metal. As shown in FIG. 9, the metalized substrate is polished using, e.g., chemical mechanical polishing (CMP), to remove excess metal and to thin down the oxide layer down to a desired thickness of, for example, from about five nm to about one $\mu m$. As highlighted above, the graphene was patterned to define a channel(s) of the circuits. As a result, source and drain metal contacts to the graphene channel (defined as described above) are formed. For ease and clarity of description, the structure shown in FIG. 9, i.e., with graphene channel(s) and metal source and drain contacts formed on a substrate (wafer) will be referred to in the following description generically as "the graphene wafer." As highlighted above, the graphene wafer includes graphene-based circuitry, e.g., one or more graphene transistors.

Figure 10:
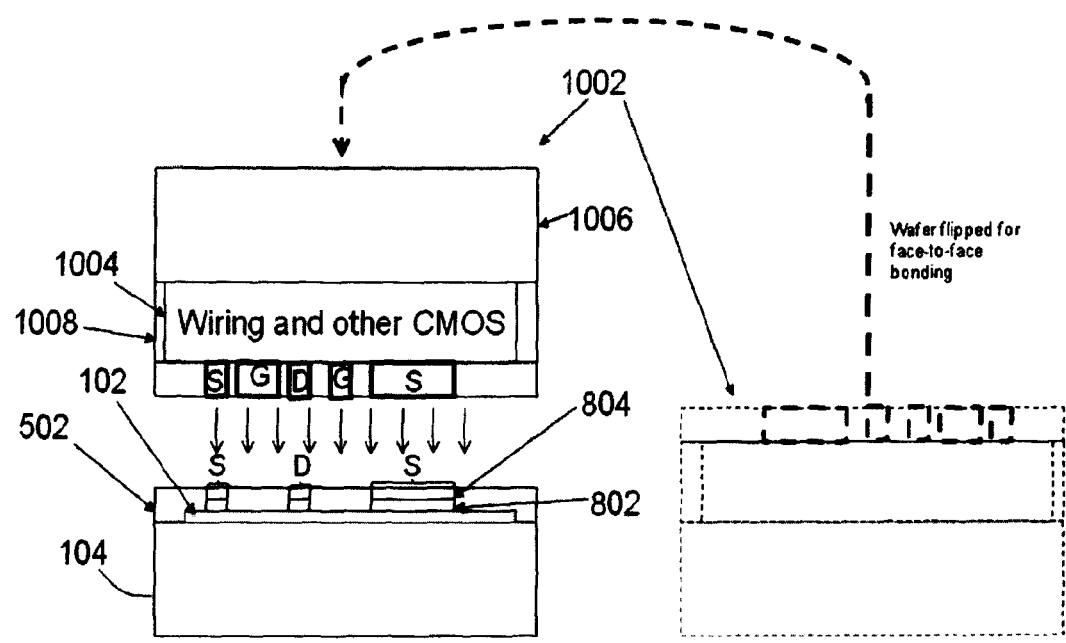
FIG. 10 is a cross-sectional diagram illustrating a wafer-to-wafer bonding scheme being used to integrate the graphene wafer of FIG. 9 with a complementary metal-oxide semiconductor (CMOS) device wafer according to an embodiment of the present invention.

FIG. 10 is a cross-sectional diagram illustrating a wafer-to-wafer bonding scheme being used to integrate the graphene wafer with a CMOS device wafer 1002. As shown in FIG. 10, CMOS device wafer 1002 has been flipped to permit face-to-face bonding with the graphene wafer. It is notable that, alternatively, the graphene wafer could be flipped to permit face-to-face bonding with the CMOS device wafer (not shown).

According to an exemplary embodiment, CMOS device wafer 1002 includes wiring and other CMOS structures and/or devices (also referred to herein collectively as "a CMOS device layer"), represented schematically by box 1004, formed in a substrate 1006. In one example, the CMOS device layer can include CMOS transistors or/and circuits for digital signal processing and/or digital-to-analog signal conversion and/or analog-to-digital signal conversion. In this example, the digital signals are processed in the CMOS device layer and analog radio frequency (rf) signals are processed by the graphene transistors in the graphene wafer.

Figure 16:
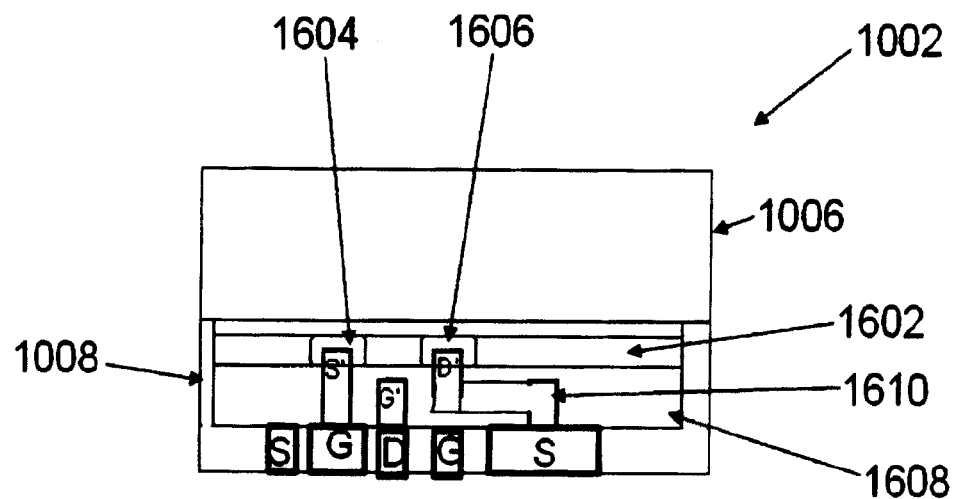
FIG. 16 is a cross-sectional diagram providing an example of how the CMOS device wafer components can be configured for integration with the graphene wafer according to an embodiment of the present invention.

According to an exemplary embodiment, substrate 1006 can be a bulk silicon or silicon-on-insulator (SOI) wafer. A SOI wafer generally consists of a silicon (SOI) layer separated from a substrate by a buried oxide (BOX). As would be apparent to one of skill in the art, when a SOI wafer is employed, the CMOS wiring, structures and/or devices may be formed in the SOI layer. Possible CMOS wiring, structures and/or devices can include, but are not limited to, metal lines, vias, memory and/or logic transistors, such as field-effect transistors (FETs). CMOS wiring, structures and/or devices and techniques for the formation thereof on a bulk silicon or SOI wafer would be apparent to one of skill in the art. In general however, a transistor includes a source, a drain and a channel(s) connecting the source and the drain. A gate, separated from the channel by a dielectric (gate dielectric), regulates electron flow through the channel. In the present teachings, metal contacts to the gates of the graphene devices are provided on the CMOS device wafer. That way, the oxide layer (i.e., oxide layer 502 already present on the graphene wafer) can effectively serve as the gate dielectric between the gate contacts and the graphene channel(s) as highlighted above. An example illustrating how the components of the CMOS device wafer can be configured for integration with the transistors of the graphene wafer is shown in FIG. 16, described below.

As shown in FIG. 10, the source, drain and gate metal contacts, S, D and G, respectively, are in contact with the CMOS device layer (i.e., the contacts are connected to the various CMOS wiring, structures and/or devices in the CMOS device layer). One example of how the source, drain and gate contacts may be connected to these components in the CMOS device layer is provided in FIG. 16, described below. In the CMOS device wafer, the source, drain and gate metal contacts to the various devices in the graphene wafer may be formed in an oxide layer, e.g., oxide layer 1008, surrounding the CMOS device layer in the same manner as described above with regard to the source and drain metal contacts in the graphene wafer. However, in this case, the Pd/Ti layer is not needed since its purpose was for promoting adhesion to the graphene sheets (see above).

Figure 11:
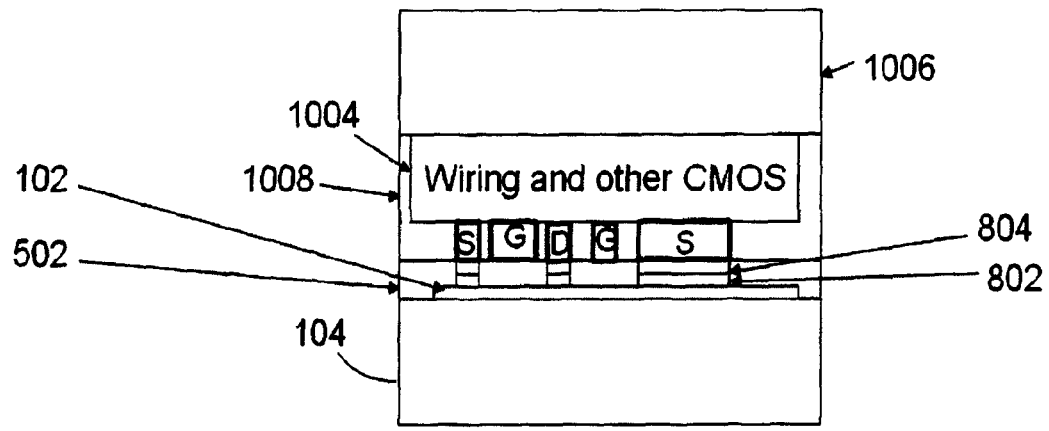
FIG. 11 is a cross-sectional diagram illustrating the graphene wafer and the CMOS device wafer having been bonded together in a face-to-face manner using wafer bonding processes according to an embodiment of the present invention.

FIG. 11 is a cross-sectional diagram illustrating the graphene wafer and the CMOS device wafer having been bonded together in a face-to-face manner using wafer bonding processes. In the exemplary embodiment shown in FIG. 11, the wafers are bonded together by way of an oxide-to-oxide bond between oxide layer 502 of the graphene wafer and oxide layer 1008 of the CMOS device wafer, as well as by way of copper-to-copper bonds between the corresponding source and drain metal contacts of the two wafers. Typically the bonding temperature is below 400 degrees Celsius (° C.). Therefore, the devices are not destroyed during the process.

3D integration has become a very promising candidate to fulfill packaging and integrated circuit (IC) technology gaps for graphene electronics. The ability to stack CMOS state-of-the-art active device layers has been demonstrated. 3D integration technology offers the promise of being a new way of increasing system performance even in the absence of scaling. It is also expected that, with the ultra high mobility carriers in graphene, the parasitic resistance and capacitance of interconnects would become more important in determining the overall circuit performance. In this respect, 3D integration provides a great advantage for graphene-based circuits. This promise is due to a number of characteristic features of 3D integration, including (a) decreased total wiring length, and thus reduced interconnect delay times, (b) dramatically increased number of interconnects between chips and (c) the ability to allow dissimilar materials, process technologies and functions to be integrated. Among these advantages, the item (c) from 3D provides a good approach to solve the thermal budget issue mentioned above.

Thus, advantages of the present techniques for producing graphene circuits include: 1) graphene can be prepared by a wide range of different approaches, including the two methods mentioned above, 2) complex circuits can be pre-fabricated in standard clean-room facilities without the potential contamination from carbon materials, 3) the alignment in the wafer bonding process ensures the graphene channels are always incorporated at the desirable positions of the circuit, 4) the requirements of existing CMOS devices, such as temperature, wet etching environment, gas ambient during process, still can be kept since graphene channels are fabricated separately on another substrate and 5) the circuit delay time, which is dominated by interconnects in the case of graphene circuits, can be significantly reduced.

Figure 12:
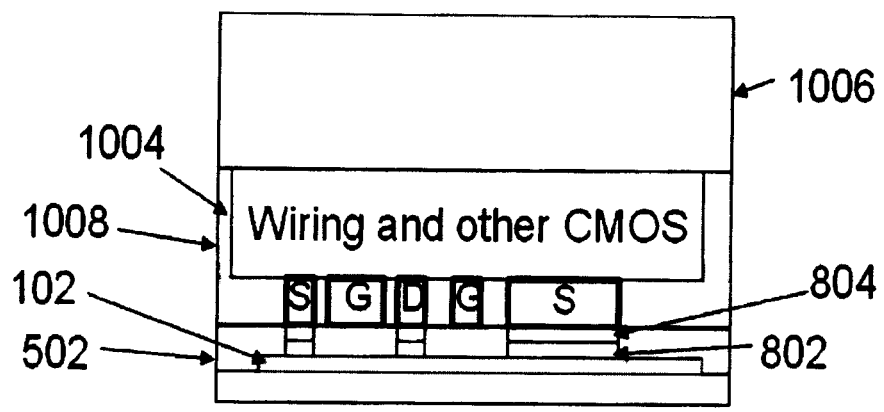
FIG. 12 is a cross-sectional diagram illustrating the substrate having been removed from the graphene wafer according to an embodiment of the present invention.
Figure 13:
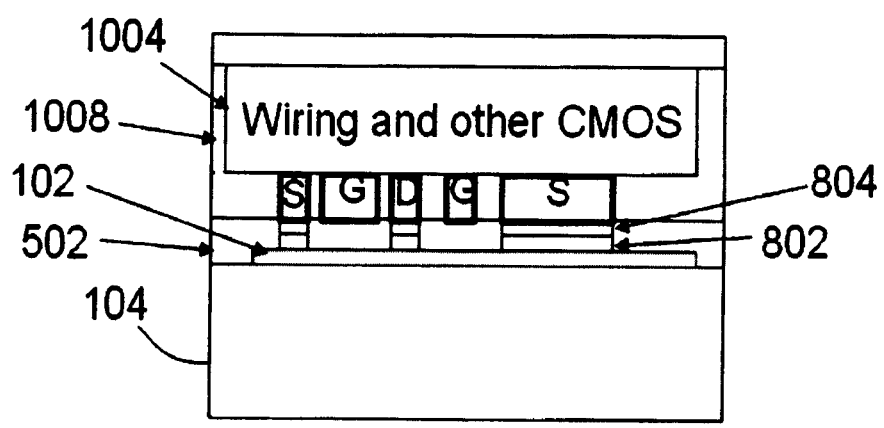
FIG. 13 is a cross-sectional diagram illustrating the substrate having been removed from the CMOS device wafer according to an embodiment of the present invention.

Further processing of the bonded wafers can now be performed. For example, the substrate can be removed from either the graphene wafer (as shown in FIG. 12 the majority of substrate 104 has been removed leaving only a small portion thereof remaining) or from the CMOS device wafer (as shown in FIG. 13 the majority of substrate 1006 has been removed leaving only a small portion thereof remaining). Since there are now two substrates from two wafers after bonding, the choice of which substrate to remove relies on the design of the circuits (i.e., to permit the fabrication of additional layers of the structure, see below). The stopping thickness of silicon from bulk silicon wafers can be selected, while the buried oxide layer is the stopping layer for SOI wafers. According to an exemplary embodiment, the desired substrate is removed using CMP or other similar polishing and/or grinding process.

Figure 14:
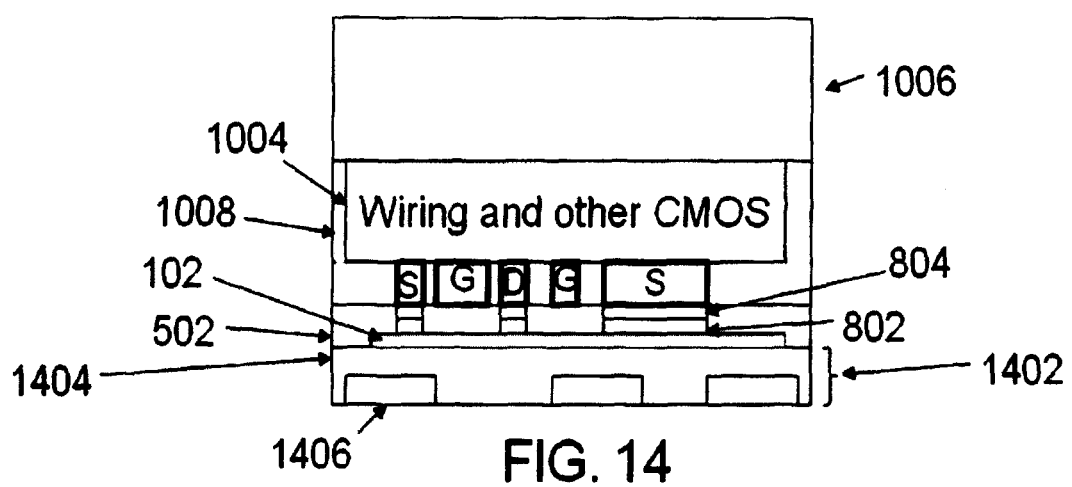
FIG. 14 is a cross-sectional diagram illustrating an additional metal layer having been added to the structure of FIG. 12 according to an embodiment of the present invention.
Figure 15:
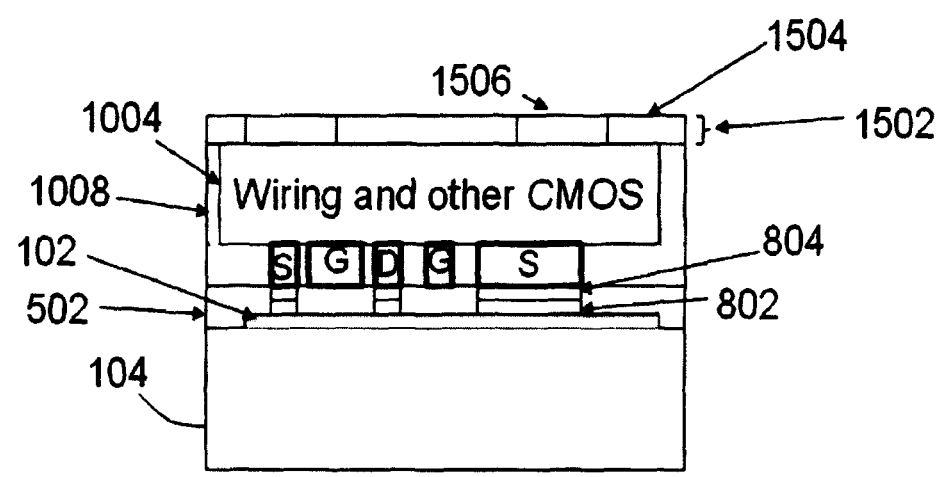
FIG. 15 is a cross-sectional diagram illustrating an additional metal layer having been added to the structure shown in FIG. 13 according to an embodiment of the present invention.

As highlighted above, the substrate is removed to permit additional device and/or metal layers to be fabricated on the bonded structure. Examples of these additional layers are shown in FIGS. 14 and 15. Namely, FIG. 14 is a cross-sectional diagram illustrating additional metal layer 1402 having been added to the structure shown in FIG. 12 (where the substrate has been removed from the graphene wafer). According to an exemplary embodiment, metal layer 1402 is formed by depositing an oxide layer 1404 and then forming metal (e.g., Cu) contacts 1406 in oxide layer 1404, in the same manner as described above. In the exemplary configuration shown in FIG. 14, contacts 1406 are not in contact with the graphene channel.

FIG. 15 is a cross-sectional diagram illustrating additional metal layer 1502 having been added to the structure shown in FIG. 13 (where the substrate has been removed from the CMOS device wafer). According to an exemplary embodiment, metal layer 1502 is formed by depositing an oxide layer 1504 and then forming metal (e.g., Cu) contacts 1506 in oxide layer 1504, in the same manner as described above.

FIG. 16 is a cross-sectional diagram providing one example of how the components of CMOS device wafer 1002 can be configured for integration with the transistors of the graphene wafer. The specific design shown in FIG. 16 is one of many possible configurations of CMOS device wafer 1002 that may be envisioned by one of skill in the art and is intended merely to illustrate how connections between the wafers may be accomplished. As shown in FIG. 16, CMOS device wafer 1002 can include a SOI layer 1602 in which doped silicon regions 1604 and 1606 are formed that constitute source and drain regions, respectively, of a CMOS transistor, e.g., a metal oxide semiconductor field effect transistor (MOSFET). Source, drain and gate metal contacts, S', D' and G', respectively, are provided to the CMOS transistor. These contacts are formed in an insulator layer 1608 and are connected with the source, drain and gate contacts in oxide layer 1008. See, for example, where a metal line 1610 is used to make this connection. Techniques for forming metal contacts in an insulator layer and then forming other metal contacts in a surrounding oxide layer would be apparent to one of ordinary skill in the art and thus are not described further herein. Mating of the CMOS device wafer with the graphene wafer may be accomplished as shown, for example, in FIGS. 10 and 11, described above. As described above, the source, drain and gate metal contacts, S, D and G, respectively, are used in completing the one or more graphene transistors in the graphene wafer. Thus, in some embodiments, the graphene wafer will contain one or more transistors and the CMOS device wafer will also contain one or more transistors (also referred to herein as "CMOS transistors"). The graphene transistors and the CMOS transistors can interface with one another using the same techniques illustrated in FIG. 16.

As highlighted above, parasitic capacitance and residual resistance are significant factors affecting conventional graphene-based transistor designs. Advantageously, the present techniques provide a way to minimize both parasitic capacitance and residual resistance, something conventional designs cannot accomplish.

FIGS. 17-36 are diagrams illustrating an exemplary methodology for fabricating a graphene-based transistor device for rf applications. As will be described in detail below, the present methodology employs self-aligned doping/gating to minimize both parasitic capacitance and residual series resistance.

Figure 17:
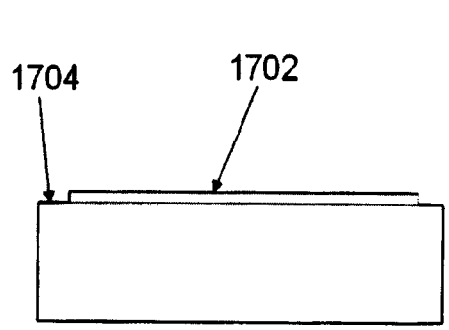
FIG. 17 is a cross-sectional diagram illustrating a graphene layer(s) having been deposited or grown on a substrate according to an embodiment of the present invention.
Figure 18:
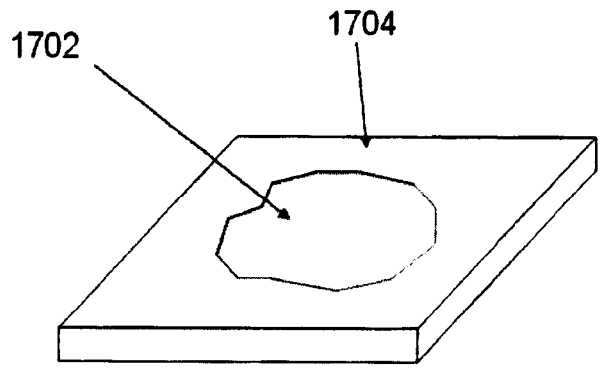
FIG. 18 is a 3D diagram illustrating a top-down view of the graphene layer(s) having been deposited or grown on substrate according to an embodiment of the present invention.

To begin the fabrication process, a graphene layer(s) is formed, i.e., deposited or grown, on a substrate as described above. Namely, FIG. 17 is a cross-sectional diagram illustrating one or more graphene layers 1702 (e.g., from a single layer up to 10 layers of graphene) having been deposited or grown on a substrate 1704. Graphene layer(s) 1702 can either be deposited on substrate 1704 via mechanical exfoliation or epitaxially grown on SiC (e.g., by silicon sublimation with epitaxy). As highlighted above, both of these graphene-forming processes are known to those of skill in the art and thus are not described further herein. When graphene layer(s) 1702 are deposited, substrate 1704 can be an insulating wafer or a wafer with an insulating overlayer, such as a Si wafer covered with $SiO_2$. When graphene layer(s) 1702 are grown, substrate 1704 can be a SiC wafer. FIG. 18 is a 3D diagram illustrating another perspective, i.e., a top-down view, of the graphene layer(s) 1702 having been deposited or grown on substrate 1704.

Next a resist mask is patterned over the graphene layer(s)/substrate to define the source and drain contact regions. Namely, FIG. 19 is a cross-sectional diagram illustrating resist mask 1902 patterned over graphene layer(s) 1702/substrate 1704. The resist mask can be a soft mask, like optical or e-beam lithography resist (PMMA, hydrogen silsesquioxane (HSQ) or S1818™, available from Rohm and Haas Electronic Materials LLC, Marlborough, Mass.) or a hard mask, like an oxide, nitride, or metal deposited by a compatible deposition method. Techniques for forming a soft or hard mask are known to those of skill in the art and thus are not described further herein. FIG. 20 is a 3D diagram illustrating another perspective, i.e., a top-down view, of resist mask 1902 patterned over graphene layer(s) 1702/substrate 1704. From the perspective shown in FIG. 20 it can be seen where the source and drain contact regions will be formed (as described further below).

The contact metal is then deposited. Namely, FIG. 21 is a cross-sectional diagram illustrating the source/drain contact metal 2102 having been deposited around the patterned resist mask 1902. As shown in FIG. 21, once the contact metal has been deposited, resist mask 1902 is removed. The selective metal contact formation follows a standard lift-off process known to those of skill in the art. The metal is first blanket deposited on the resist mask 1902/substrate 1704 by e-beam evaporation, thermal evaporation or sputtering. Metals such as Pd, Ti, gold (Au), Al, tungsten (W) can be used as the contact metal. After the blanket metal deposition, the resist mask 1902 is removed in an appropriate solvent, and by doing so, removing the metal on the resist mask at the same time. According to an exemplary embodiment, the resist mask 1902 is made of PMMA and can be removed using acetone as the solvent in the lift-off process. FIG. 22 is a 3D diagram illustrating another perspective, i.e., a top-down view, of the source/drain contact metal 2102 having been deposited around the patterned resist mask 1902.

A protective hard or soft mask is then patterned on the graphene to define the active channel region of the device. Namely, FIG. 23 is a cross-sectional diagram illustrating mask 2302 patterned on graphene layer(s) 1702. Again, the techniques for forming a soft or hard mask are known to those of skill in the art and thus are not described further herein. FIG. 24 is a 3D diagram illustrating another perspective, i.e., a top-down view, of mask 2302 patterned on graphene layer(s) 1702.

Figure 25:
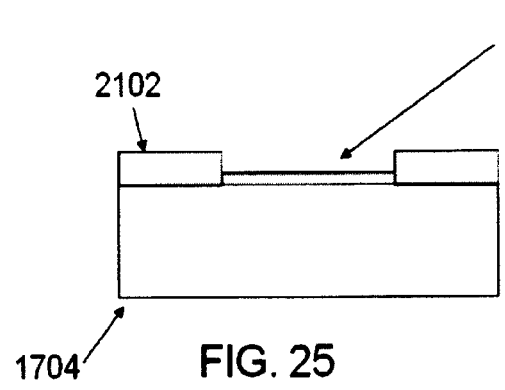
FIG. 25 is a cross-sectional diagram illustrating portions of the graphene layer(s) not protected by the mask having been etched away, and thus defining a graphene channel according to an embodiment of the present invention.
Figure 26:
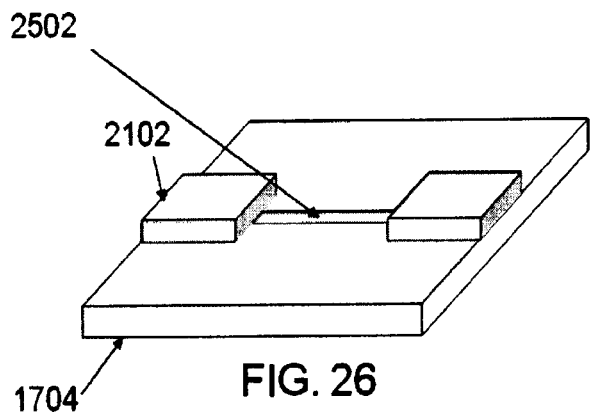
FIG. 26 is a 3D diagram illustrating a top-down view of portions of the graphene layer(s) not protected by the mask having been etched away, and thus defining a graphene channel according to an embodiment of the present invention.

The unprotected graphene is then removed. Namely, FIG. 25 is a cross-sectional diagram illustrating portions of graphene layer(s) 1702 not protected by mask 2302 having been etched away, e.g., by dry etching techniques (e.g., $O_2$ plasma) defining channel 2502 of the device. As shown in FIG. 25, mask 2302 has also been removed in appropriate solutions. According to an exemplary embodiment, the etch mask 2302 is made of PMMA and can be removed in acetone. FIG. 26 is a 3D diagram illustrating another perspective, i.e., a top-down view, of portions of graphene sheets 1702 not protected by mask 2302 having been etched away.

Figure 27:
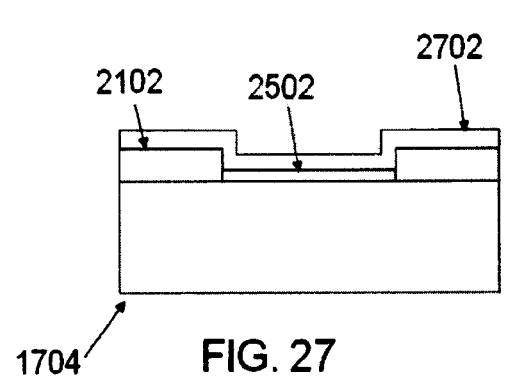
FIG. 27 is a cross-sectional diagram illustrating a gate dielectric having been blanket deposited over the graphene channel, the source and drain metal contacts and the substrate according to an embodiment of the present invention.
Figure 28:
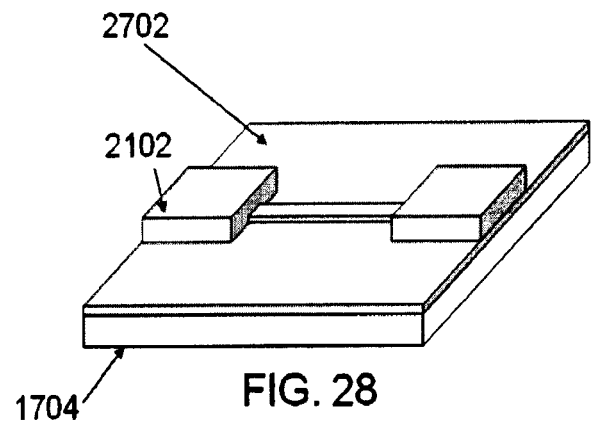
FIG. 28 is a 3D diagram illustrating a top-down view of the gate dielectric having been blanket deposited over the graphene channel, the source and drain metal contacts and the substrate according to an embodiment of the present invention.

After removing the protective mask to expose the graphene channel, a gate dielectric is deposited on the surface of the device. Namely, FIG. 27 is a cross-sectional diagram illustrating gate dielectric 2702 (e.g., an oxide) having been blanket deposited over the device, i.e., over graphene channel 2502, the source and drain metal contacts 2102 and substrate 1704 (see FIG. 28). According to an exemplary embodiment, gate dielectric 2702 is deposited using ALD, CVD, plasma sputtering or e-beam deposition. Depending on the deposition technique used and the thickness of the dielectric deposited, the surface of the graphene channel may require functionalization to ensure proper dielectric coverage. As an example, the graphene can be functionalized by reacting it with $NO_2$ prior to the ALD oxide deposition. As another example, a thin layer of Al, from about one nm to about two nm thick, is deposited and naturally oxidized on the graphene surface prior to the ALD process. FIG. 28 is a 3D diagram illustrating another perspective, i.e., a top-down view, of gate dielectric 2702 having been blanket deposited over graphene channel 2502, the source and drain metal contacts 2102 and substrate 1704.

Figure 29:
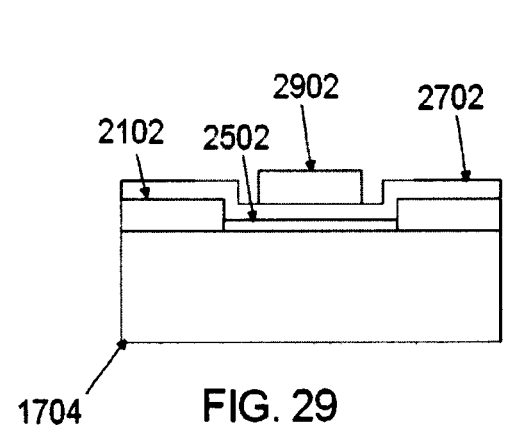
FIG. 29 is a cross-sectional diagram illustrating a gate metal contact patterned over the graphene channel and separated from the graphene channel by the gate dielectric according to an embodiment of the present invention.
Figure 30:
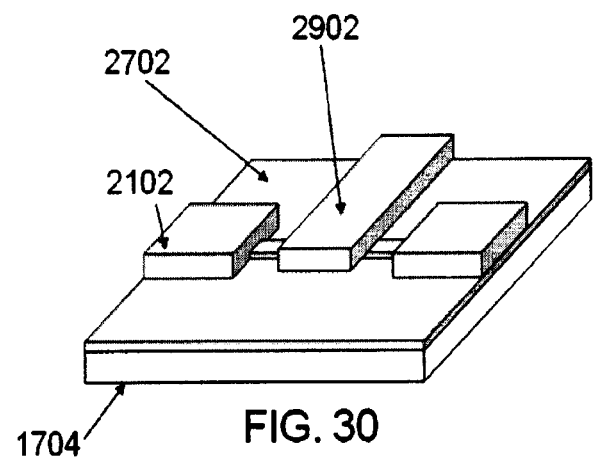
FIG. 30 is a 3D diagram illustrating a top-down view of the gate metal contact patterned over the graphene channel and separated from the graphene channel by the gate dielectric according to an embodiment of the present invention.

After dielectric deposition, a gate metal contact is patterned on top of the graphene channel. Namely, FIG. 29 is a cross-sectional diagram illustrating gate metal contact 2902 patterned over graphene channel 2502 and separated from graphene channel 2502 by gate dielectric 2702. Standard lithographic processes are used in patterning gate metal contact 2902. It is notable from FIG. 29 and FIG. 30 (described below) that gate metal contact 2902 is positioned so as not to extend over (does not overlap) source and drain metal contacts 2102. This configuration is also referred to herein as an underlapping gate configuration, i.e., the gate metal contact underlaps the source and drain metal contacts. FIG. 30 is a 3D diagram illustrating another perspective, i.e., a top-down view, of gate metal contact 2902 patterned over graphene channel 2502 and separated from graphene channel 2502 by gate dielectric 2702.

The portions of the dielectric that are not covered by the gate metal contact are then etched away. Namely, FIG. 31 is a cross-sectional diagram illustrating the portions of gate dielectric 2702 not covered by gate metal contact 2902 having been etched away. This leaves exposed sections 3102 of the graphene channel on either side of gate metal contact 2902. According to an exemplary embodiment, the dielectric is made of aluminum oxide ($Al_2O_3$) and is etched away using phosphoric acid (all dielectric should be removed to expose sections 3102 of the graphene channel on either side of gate metal contact 2902). FIG. 32 is a 3D diagram illustrating another perspective, i.e., a top-down view, of the portions of gate dielectric 2702 not covered by gate metal contact 2902 having been etched away.

Chemical doping is then performed to dope the exposed sections (i.e., sections 3102) of the graphene channel. Namely, FIG. 33 is a cross-sectional diagram illustrating a dopant 3302 having been applied to the device surface, i.e., blanket deposited over source and drain metal contacts 2102, gate metal contact 2902, exposed sections 3102 of the graphene channel and substrate 1704 (see FIG. 34, described below). Dopant 3302 is an n-type (e.g., poly(ethylene imine) (PEI)) or p-type (e.g., diazonium salts) molecular dopant. The sections of the graphene channel that are exposed to the dopant (i.e., sections 3102) are defined by the position of the gate electrode, resulting in a self-aligned doping/gating structure. As shown in FIG. 33, in this process the gate metal contact is used as the etching mask for dielectric removal and the doping mask to define the doping region. FIG. 34 is a 3D diagram illustrating another perspective, i.e., a top-down view, of dopant 3302 having been blanket deposited over source and drain metal contacts 2102, gate metal contact 2902, exposed sections 3102 of the graphene channel and substrate 1704.

With the present techniques, parasitic capacitance is minimized by the self-aligned gate, similar to an underlaped structure, and the residual series resistance is minimized by the chemical doping in the ungated region. For p-type (or n-type) devices, p-type (or n-type) dopants are employed to ensure that the carrier mobility of the dominant transport branch is not degraded by the dopants. It is expected that, with the present design, the performance of a graphene rf device will be improved. In particular, the present techniques adopt a new chemical doping scheme to control the device properties without introducing additional capacitances that affect the device performance, as explained below. One of the major challenges in controlling the graphene properties lies in the inability to alter the chemical potential of graphene with dopants that are stable and that do not degrade the graphene carrier mobility. For example, graphene exhibits n-type behavior when exposed to potassium, but this doping method also introduces scattering centers that suppress electronic conduction, thus ruining the desirable electronic properties afforded by graphene. Furthermore, potassium is chemically unstable, and can easily diffuse and migrate in materials, creating unwanted inhomogeneities. One possible solution to work around this problem is to use electrostatic doping, where the Fermi energy is controlled by electrical gating. However, this electrical doping method is not easily scalable, and may introduce parasitic capacitances. Therefore, chemical doping is preferred, but adequate dopants are still needed. Two molecular dopants (polyethylene imine (PEI) and diazonium salt) are known to provide n-type doping and p-type doping, respectively, in graphene. These two molecular dopants also selectively preserve either electron or hole carrier mobility in graphene, and are utilized here in the fabrication of high performance graphene rf devices.

Next, as an optional step, the device can be encapsulated in a protective capping layer. Namely, FIG. 35 is a cross-sectional diagram illustrating a protective capping layer 3502 having been formed over the device, i.e., over source and drain metal contacts 2102, gate metal contact 2902, exposed sections 3102 of the graphene channel and substrate 1704. According to an exemplary embodiment, protective capping layer is made up of an oxide or nitride material and is deposited using e-beam evaporation, ALD or CVD. The purpose of protective capping layer 3502 is to isolate the graphene channel from the environments that may affect its electronic properties. FIG. 36 is a 3D diagram illustrating another perspective, i.e., a top-down view, of protective capping layer 3502 having been formed over source and drain metal contacts 2102, gate metal contact 2902, exposed sections 3102 of the graphene channel and substrate 1704.

Thus, with the present device design parasitic resistances and capacitances are minimized simultaneously, allowing for an overall enhancement of the device performance. The advantages of this new approach for fabricating graphene rf devices are that 1) parasitic resistance and capacitance are minimized by the self-aligned gating/doping which enhances the high frequency functionality of the device, 2) a self-aligning technique is used to pattern the doping profile which reduces the complexity of the fabrication process and ensures optimal control over device variations and 3) the high carrier mobility of graphene is preserved by using dopants that do not degrade the desired carrier branch. Depending on the dopant used, either electron or hole mobility is preserved. For example, PEI preserves electron mobility, while diazonium preserves hole mobility.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:
a first wafer having at least one graphene channel formed on a first substrate, a first oxide layer surrounding the graphene channel and source and drain contacts to the graphene channel that extend through the first oxide layer; and
a second wafer having a complementary metal oxide semiconductor (CMOS) device layer formed in a second substrate, a second oxide layer surrounding the CMOS device layer and a plurality of contacts to the CMOS device layer that extend through the second oxide layer, the plurality of contacts to the CMOS device layer comprising at least one or more first contacts to the CMOS device layer and at least one or more second contacts to the CMOS device layer, the first wafer and the second wafer being bonded together by way of an oxide-to-oxide bond between the first and second oxide layers,
wherein the one or more first contacts to the CMOS device layer are in contact with the source and drain contacts to the graphene channel, and wherein the one or more second contacts to the CMOS device layer are gate contacts for the graphene channel.

2. The device of claim 1, wherein the CMOS device layer comprises one or more CMOS wiring, structures and devices.

3. The device of claim 1, wherein the first substrate comprises an insulating wafer or a wafer having an insulating overlayer.

4. The device of claim 1, wherein the first substrate comprises a silicon carbide wafer.

5. The device of claim 1, wherein the second substrate comprises a silicon-on-insulator wafer or a bulk silicon wafer.

6. The device of claim 1, wherein the source and drain contacts to the graphene channel and the contacts to the CMOS device layer each comprises copper, and wherein the first wafer and the second wafer are further bonded together by way of a copper-to-copper bond between the source and drain contacts to the graphene channel and one or more of the contacts to the CMOS device layer.

7. The device of claim 1, wherein the first wafer and the second wafer are bonded together in a face-to-face orientation.

8. The device of claim 1, further comprising a layer of oxidized aluminum formed on the graphene channel over which the first oxide layer is formed.

9. The device of claim 8, wherein the layer of oxidized aluminum has a thickness of from about one nanometer to about two nanometers.

10. The device of claim 1, wherein the at least one graphene channel comprises one or more layers of graphene having a channel layout patterned therein.

11. The device of claim 1, wherein the source and drain contacts to the graphene channel include a first metal layer, comprising palladium and titanium, in contact with the graphene channel, and a second metal layer, comprising copper, in contact with the first metal layer.

12. The device of claim 1, wherein the first oxide layer serves as a gate dielectric between the gate contacts and the graphene channel.

* * * * *